United States Patent
Rao et al.

(10) Patent No.: US 7,189,615 B2
(45) Date of Patent: Mar. 13, 2007

(54) SINGLE MASK MIM CAPACITOR AND RESISTOR WITH IN TRENCH COPPER DRIFT BARRIER

(75) Inventors: Satyavolu Srinivas Papa Rao, Garland, TX (US); Darius Lammont Crenshaw, Allen, TX (US); Stephan Grunow, Dallas, TX (US); Kenneth D. Brennan, Plano, TX (US); Somit Joshi, Sunnyvale, CA (US); Montray Leavy, McKinney, TX (US); Phillip D. Matz, McKinney, TX (US); Sameer Kumar Ajmera, Richardson, TX (US); Yuri E. Solomentsev, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 36 days.

(21) Appl. No.: 11/037,530

(22) Filed: Jan. 18, 2005

(65) Prior Publication Data

US 2006/0160299 A1 Jul. 20, 2006

(51) Int. Cl.
*H01L 21/8242* (2006.01)
(52) U.S. Cl. .................. 438/250; 438/200; 438/201
(58) Field of Classification Search .............. 438/200, 438/201, 250, 627, 637, 643
See application file for complete search history.

(56) References Cited

U.S. PATENT DOCUMENTS

| 6,451,664 | B1 |  | 9/2002 | Barth et al. |
| 6,555,171 | B1 | * | 4/2003 | Lopatin ............... 427/305 |
| 6,838,352 | B1 | * | 1/2005 | Zhao .................. 438/386 |
| 6,908,802 | B2 | * | 6/2005 | Ramesh ............... 438/200 |

* cited by examiner

*Primary Examiner*—Phuc T. Dang
(74) *Attorney, Agent, or Firm*—Peter K. McLarty; W. James Brady, III; Frederick J. Telecky, Jr.

(57) ABSTRACT

The formation of a MIM (metal insulator metal) capacitor (164) and concurrent formation of a resistor (166) is disclosed. A copper diffusion barrier (124) is formed over a copper deposition (110) that serves as a bottom electrode (170) of the capacitor (164). The copper diffusion barrier (124) mitigates unwanted diffusion of copper from the copper deposition (110), and is formed via electro-less deposition such that little to none of the barrier material is deposited at locations other than over a top surface (125) of the deposition of copper/bottom electrode. Subsequently, layers of dielectric (150) and conductive (152) materials are applied to form a dielectric (172) and top electrode (174) of the MIM capacitor (164), respectively, where the layer of conductive top electrode material (152) also functions to concurrently develop the resistor (166) on the same chip as the capacitor (164).

19 Claims, 11 Drawing Sheets

SINGLE MASK MIM CAPACITOR AND RESISTOR WITH IN TRENCH COPPER DRIFT BARRIER

FIELD OF INVENTION

The present invention relates generally to semiconductor devices, and more particularly to fabricating a MIM capacitor having a copper diffusion barrier and concurrently forming a resistor.

BACKGROUND OF THE INVENTION

In the manufacture of semiconductor products such as integrated circuits, individual electrical devices are formed on or in a semiconductor substrate, and are thereafter interconnected to form circuits. Interconnection of these devices is typically accomplished by forming a multi-level interconnect network in and through one or more dielectric or non-conductive layers that are formed over the electrical devices to electrically isolate the devices from one another. A conductive material, such as copper, is deposited into vias and/or trenches formed within these dielectric layers to connect the devices and thereby establish the multi-level interconnect network.

MIM (metal insulator metal) capacitors are semiconductor devices that are formed by sandwiching a thin layer or film of dielectric material between two layers of conductive material, usually metals. The metal layers can be said to comprise some or all of top and bottom electrodes, respectively, of the capacitor. It is generally advantageous to have at least some of the bottom electrode comprise a copper via or trench. At times, however, the copper can diffuse through the dielectric layer up to the top electrode, such as during normal operation of the capacitor as the electric field induced during operation naturally enhances the undesired transport of copper from one electrode to the other. Such movement of copper can "short out" or provide a conductive pathway between the two metal layers. Additionally, modern circuit demands are requiring MIM capacitors to have a high capacitance density. This is achieved by having larger area capacitors (e.g., greater than about three square microns). However, larger area capacitors can suffer from enhanced copper drift and diffusion probability (due to random defects in the dielectric), and can also have an increased propensity for copper hillocking whereby non-uniformities are developed at a top surface of the bottom electrode, which can further exacerbate copper drift. This can substantially compromise the capacitor's ability to perform its intended function of storing charge.

It can be appreciated that several trends presently exist in the electronics industry. Devices are continually getting smaller, faster and requiring less power, while simultaneously being able to support and perform a greater number of increasingly complex and sophisticated functions. One reason for these trends is an ever increasing demand for small, portable and multifunctional electronic devices. For example, cellular phones, personal computing devices, and personal sound systems are devices which are in great demand in the consumer market. These devices rely on one or more small batteries as a power source and also require an ever increasing computational speed and storage capacity to store and process data, such as digital audio, digital video, contact information, database data and the like.

Accordingly, there is a continuing trend in the semiconductor industry to manufacture integrated circuits (ICs) with higher densities. To achieve high densities, there has been and continues to be efforts toward scaling down dimensions (e.g., at submicron levels) on semiconductor wafers. In order to accomplish such high densities, smaller feature sizes, smaller separations between features and layers, and/or more precise feature shapes are required. The scaling-down of integrated circuit dimensions can facilitate faster circuit performance and/or switching speeds, and can lead to higher effective yield in IC fabrication by providing more circuits on a semiconductor die and/or more die per semiconductor wafer, for example.

As device sizes continue to shrink, however, the close proximity of certain areas can lead to undesirable results. With regard to MIM capacitors, for example, bringing the metal layers closer together by reducing the thickness of the thin dielectric film can allow diffused copper to more readily short out the capacitor thereby compromising the capacitor's reliability and useful life. Still, a thin dielectric layer remains desirable as the capacitance, or ability of a capacitor to store charge, changes as a function of the distance between the metal plates, among other things. In particular, the capacitance goes up as the plates are brought closer together, but decreases as the plates are moved further apart. Accordingly, it would be desirable to fabricate a MIM capacitor in a manner that mitigates adverse effects associated with copper diffusion while concurrently allowing the size of the device to be reduced. Further, it can be appreciated that it is generally desirable to streamline fabrication processes so that one or more different types of semiconductor devices or elements can be produced with a minimal number of actions, thus enhancing yield.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to forming a MIM (metal insulator metal) capacitor in an efficient manner that facilitates device scaling while mitigating copper diffusion, and also allows a resistor to be concurrently formed elsewhere on the device. According to one or more aspects of the present invention, a method of forming a MIM capacitor includes forming a layer of copper diffusion barrier material over a top surface of a deposition of copper that serves as at least some of a bottom electrode of the capacitor, wherein the barrier material is deposited via an electro-less deposition process whereby little to no barrier material forms on exposed surfaces other than the top surface of the copper deposition. The method also includes forming a capacitor dielectric over the diffusion barrier and forming a capacitor top electrode over the capacitor dielectric.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
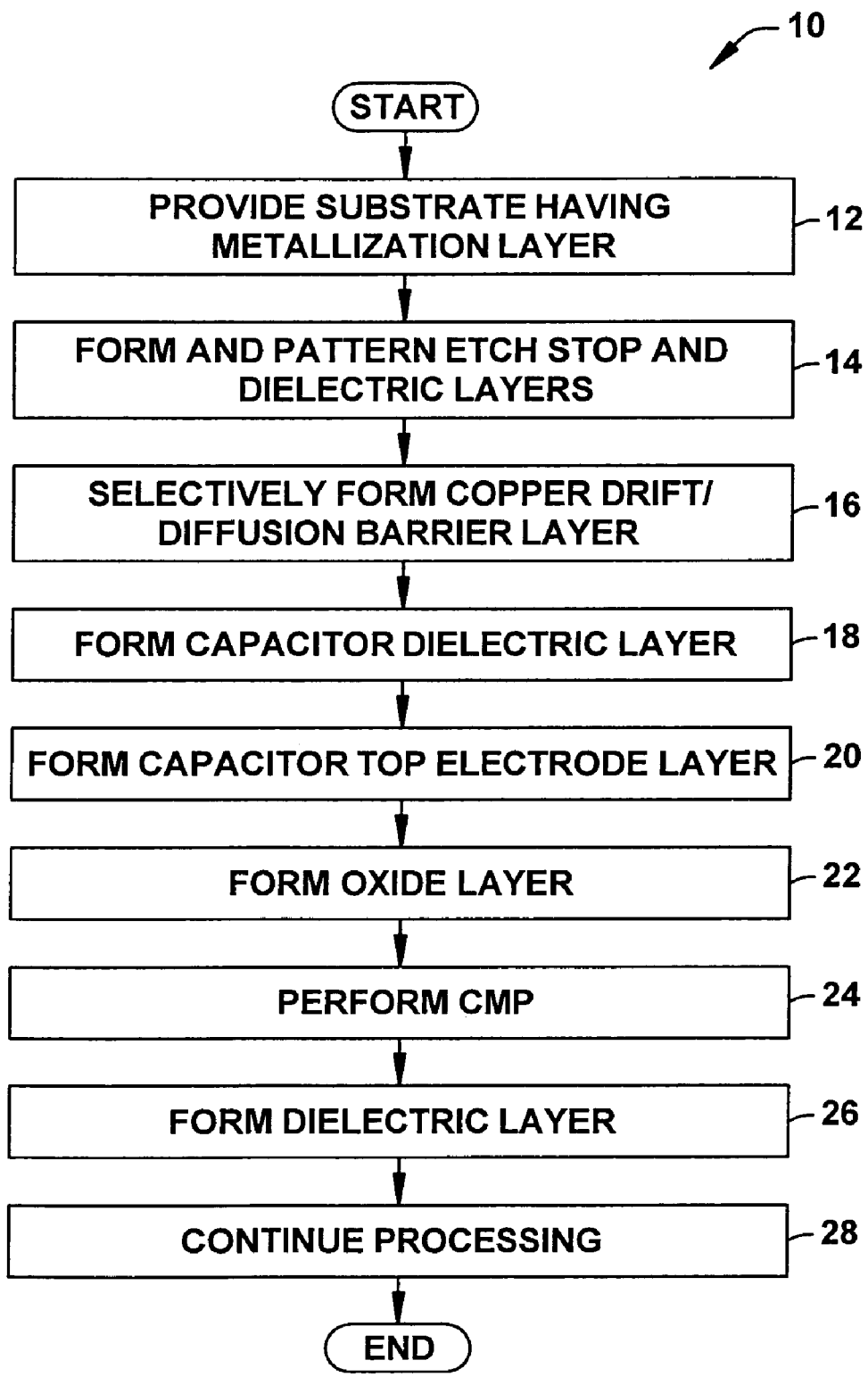
FIG. 1 is a flow diagram illustrating an exemplary methodology for forming a MIM (metal insulator metal) capacitor in accordance with one or more aspects of the present invention.

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced, subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

The present invention relates to forming a MIM (metal insulator metal) capacitor in an efficient manner that facilitates device scaling while mitigating copper diffusion. In particular, a copper diffusion barrier is formed over a copper deposition that serves as a bottom electrode of the capacitor. The copper diffusion barrier is formed via electro-less deposition such that little to none of the barrier material is deposited at locations other than over a top surface of the deposition of copper/bottom electrode. Note that since the diffusion barrier is conductive, it may also comprise some of the bottom electrode of the capacitor. Subsequently, layers of dielectric and conductive materials are applied to form a dielectric and top electrode of the MIM capacitor, respectively. Further, the process allows a resistor type element to be produced from the layer of top electrode material while the capacitor is being formed.

Turning to FIG. 1, an exemplary methodology 10 is illustrated for concurrently forming a MIM (metal insulator metal) capacitor and resistor according to one or more aspects of the present invention. Although the methodology 10 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein.

The methodology 10 begins at 12 wherein a semiconductor substrate is provided or obtained that has been processed through formation of a metallization layer. It is to be appreciated that substrate or semiconductor substrate as used herein can include a base semiconductor wafer or any portion thereof (e.g., one or more wafer die) as well as any epitaxial layers or other type of semiconductor layers formed thereover and/or associated therewith. The substrate can comprise, for example, silicon, SiGe, GaAs, InP and/or SOI. In addition, the substrate can include various device elements formed therein such as transistors, for example, and/or layers thereon. These can include metal layers, barrier layers, dielectric layers, device structures, including silicon gates, word lines, source regions, drain regions, bit lines, bases, emitters, collectors, conductive lines, conductive vias, etc. After obtaining the substrate, the methodology advances to 14 wherein layers of an etch stop material and dielectric material are sequentially formed over the substrate and patterned (e.g., via etching and/or lithographic techniques).

Figure 2:
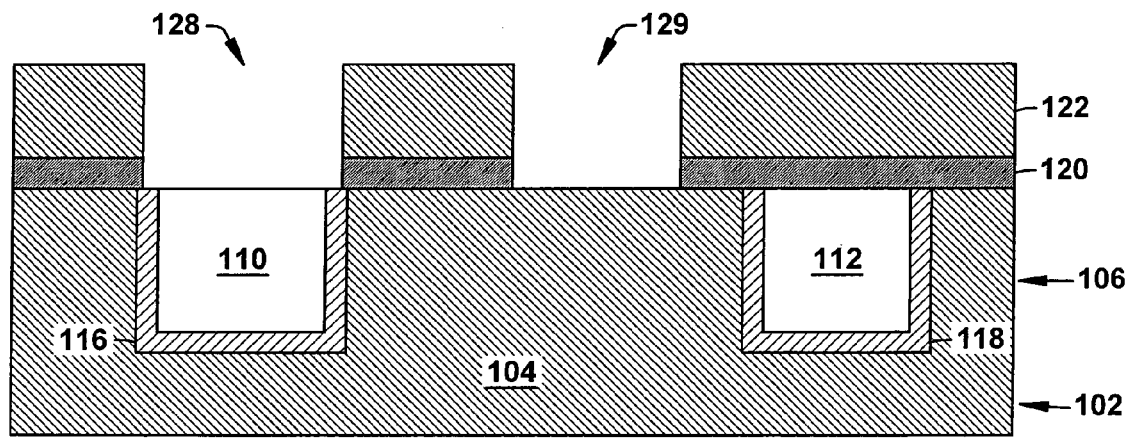
FIGS. 2–9 are cross-sectional illustrations of a MIM capacitor and resistor being concurrently formed according to one or more aspects of the present invention, such as that set forth in FIG. 1.

FIG. 2 is a cross-sectional illustration of a semiconductor substrate 102 processed through this point in the fabrication process. In the illustrated example, the substrate 102 includes, but is not limited to, an interlayer or interlevel dielectric 104 and a metallization layer 106. The metallization layer 106 includes some of the dielectric material 104 and one or more metals, namely first and second metals 110, 112 in the illustrated example. The metals form conductive lines and facilitate electrical contact with surrounding structures through vias and/or trenches formed within dielectric layers. In the illustrated example, the metals are surrounded by respective diffusion barriers 116, 118. The metals 110, 112 generally include copper while the diffusion barriers 116, 118 may include tantalum, or a variety of one or more other barrier materials, for example. It is to be appreciated that the substrate 102 can include one or more metallization layers or other elements that are not illustrated. Further, the metallization layer 106 may comprise on or more layers of metallization as may be desired.

A layer of an etch stop material 120 is formed over the substrate 102 and the metals 110, 112, with a layer of a dielectric material 122 formed over the etch stop layer 120. Although not shown, it will be appreciated that an optional layer of hardmask material may be formed over the layer of dielectric material 122. In addition to serving as an etch stop, layer 120 may also be referred to as a protective overcoat in that it provides electrical isolation and/or mechanical protection for underlying layers and/or structures, as well as chemical and/or ion protection, for example. Layer 120 may include one or more layers that may comprise silicon nitride, silicon oxynitride, silicon oxide, silicon dioxide, silicon carbonitride, organic polymers such as polyimide and/or other materials, for example. Layer 120 can be referred to as an etch stop layer because of its selectivity to different etching chemistries. For example, layer 120 may not be etched when layer 122 is etched or it may be etched at a much slower rate than layer 122. Thus, layer 120 may "signal" when layer 122 has been etched through by providing a significantly reduced etch rate. By way of example only and not limitation, layer 120 can be formed to a thickness of between about 100 to about 800 angstroms.

Similarly, layer 122 and an optional layer of hardmask material may also be referred to as protective overcoats and may respectively include one or more layers, where the hardmask layer can be chosen to be included or left out by one skilled in the art. Dielectric layer 122 may comprise an inter layer/level dielectric (ILD) that includes one or more of a silicon-oxide based, organo-silicon based, or polymer based material formed to between about 2000 to about 5000 angstroms, for example, whereas a hardmask layer may include silicon oxynitride and/or silicon carbide, silicon nitride, or silicon oxide, for example, and be formed to between about 300 to about 2000 angstroms, for example. Further, the layer of dielectric material 122 may include low dielectric constant (low-k) materials, which may or may not be porous. Examples of low-k materials include spin-on-glasses (SOGs), as well as organic and/or inorganic materials such as silsesquioxanes, fluorinated silica glasses (FSGs), fluorinated polyarylene ethers and other polymers. Other low-k insulator materials include organo-silicate-glasses (OSGs), for example, having dielectric constants (k) as low as about 2.6–2.9, and ultra low-k dielectrics having dielectric constants below 2.6. OSG materials, for example, may be low density silicate glasses to which alkyl groups have been added to achieve a low-k dielectric characteristic. It may be desirable to utilize low-k materials between conductive (metal) layers since the low-k materials may reduce capacitive coupling between the layers and reduce RC delay times and thereby increase circuit speed.

The layer of etch stop material 120 and dielectric or ILD material 122 are patterned so that first and second apertures 128, 129 are formed therein. In the illustrated example, the first aperture 128 is formed over the first metal 110, while the second aperture 129 is not formed over a metal. It will be appreciated that the first aperture facilitates developing the MIM capacitor while the second aperture 129 (which may be relatively long and narrow) facilitates developing the resistor. As with all layers described herein (unless specifically indicated otherwise), layers 120 and 122 can be patterned in any suitable manner, such as via etching and/or lithographic techniques, where lithography refers to processes for transferring one or more patterns between various media.

Figure 3:
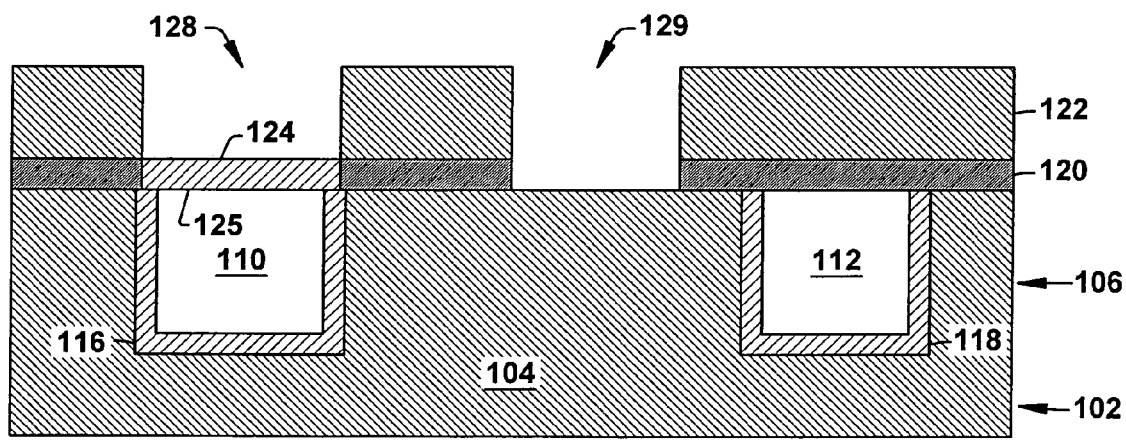

Next, at 16 in FIG. 1, a copper drift/diffusion barrier is formed over the exposed copper. In particular, the copper diffusion barrier is deposited via an electro-less deposition process according to one or more aspects of the present invention. This can be seen in FIG. 3 where the electro-less deposition process serves to deposit diffusion barrier material 124 over a top surface 125 of the conductive copper 110, where electro-less deposition generally refers to depositing a material without the application of electric current. In such a case, electrons are supplied by a reducing agent present in a solution. The presence of a catalytic surface with the reducing agent facilitates the electro-less deposition process. Further, in addition to mitigating hillock formation, the electro-less deposition process serves to deposit little to no barrier material on other exposed surfaces so that additional patterning and/or etching actions are not needed, or are at least mitigated. Nevertheless, it will be appreciated that pre and/or post treatments may be performed to improve the diffusion barrier 124 formation process. For example, an optional light wet etch may be performed after depositing the barrier layer 124 to remove spurious nuclei of barrier material that may be formed on vertical and/or horizontal surfaces of the ILD layer 122.

The copper barrier material 124 may comprise any suitable electrically conductive metal barriers which serve as metallurgically stable or passive copper barriers, such as Cr, W, Ta, Mo, Rh, Ru. It will be appreciated that these elemental barriers candidates may or may not be deposited as a binary alloy containing a refractory metal such as Tungsten or Co(W), or as a tertiary alloy containing both a refractory metal and a non metallic or semi-metallic elements such as CoWP or CoWB. Co, W, Ta, and Mo, for example, as well as palladium-activated and palladium-free barriers, such as CoWP, CoWB (e.g., with greater than about 10% W and greater than about 10% non-metal content), NiMoP and NiMoB, for example. Further, the copper diffusion barrier 124 is formed to less than about 500 angstroms, and is stable to back end of the line (BEOL) processing, such as to temperatures of up to about 400 degrees Celsius, for example. Where a palladium activated substance is utilized for the diffusion barrier 124, for example, a thin layer of palladium (e.g., of less than about 300 angstroms) may be deposited from a palladium chloride solution after an initial cleaning is performed, followed by the electro-less deposition. Alternatively, if a palladium activated substance is not used, then the electro-less deposition is performed directly onto the pre-cleaned surface 125 of the copper 110 without palladium.

Figure 4:
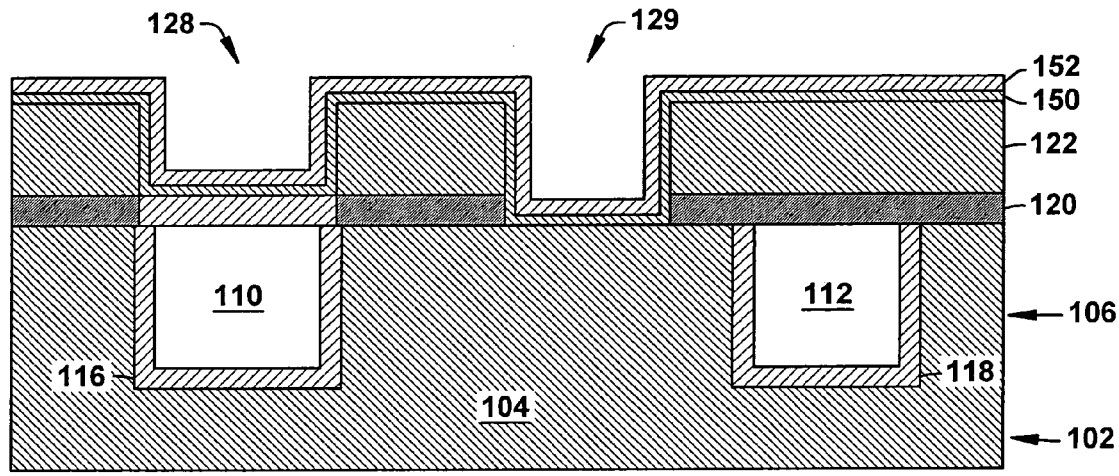

Following the formation of the copper diffusion barrier, the methodology 10 of FIG. 1 advances to the 18 where a layer of capacitor dielectric material is formed, followed by 20 where a layer of capacitor top electrode material is formed. This can be seen in FIG. 4 wherein the layer of capacitor dielectric material 150 and layer of capacitor top electrode material 152 are formed over exposed surfaces and down into apertures 128 and 129. As with all layers described herein (unless otherwise stated), these layers are substantially conformally formed. It will be appreciated that the capacitor dielectric layer 150 can be formed of any one or more suitable materials, such as nitride based materials and/or those set forth above with regard to the layer of dielectric material 122. It will also be appreciated that it may be desirable at times to form different dielectric layers from the same or similar materials so that the layers have similar reactions to subsequent treatments (e.g., etching, CMP). At other times, however, it may be desirable to form different layers from different materials so that they respond differently to subsequent treatments (e.g., have different etch rates).

Layer 150 may be formed in any suitable manner, such as via low temperature (e.g., less than or equal to about 400 degrees Celsius when Copper is present) plasma enhanced chemical vapor deposition (PECVD), for example, but is generally formed to a thickness of less than about 600 angstroms, for example. The layer of top electrode material 152 can likewise be formed in any suitable manner (e.g., CVD, PVD) from any suitable materials (e.g., TiN, Ta, TaN, W) to a thickness of between about 400 to about 900 angstroms, for example. Preferably, the metallic material(s) comprising the top electrode layer 152, and the thickness chosen are such that they are not readily sputtered away in subsequent barrier/seed processing. Additionally, layer 152 is conductive and thus allows a resistor to be established in aperture 129 as the capacitor is formed. Additional functions of layer 152 include serving as a barrier to limit copper diffusion and preventing capacitor punchthrough during subsequent etches. Capacitor punchthrough refers to a failure mode occurring in a subsequent downstream etch where layer 152 is etched through allowing some or all of layer 150 to also be etched through. The punchthrough aperture could be filled with a conductive material during processing and thereby short out the capacitor. Layer 152 can act as an etch stop for subsequent etches preventing further etching into layer 150 and below. Further functions of layer 152 can include providing low electrical resistance between other metallization layers and/or surrounding metals that fill vias, as well as providing good adhesion between such metals.

Figure 5:
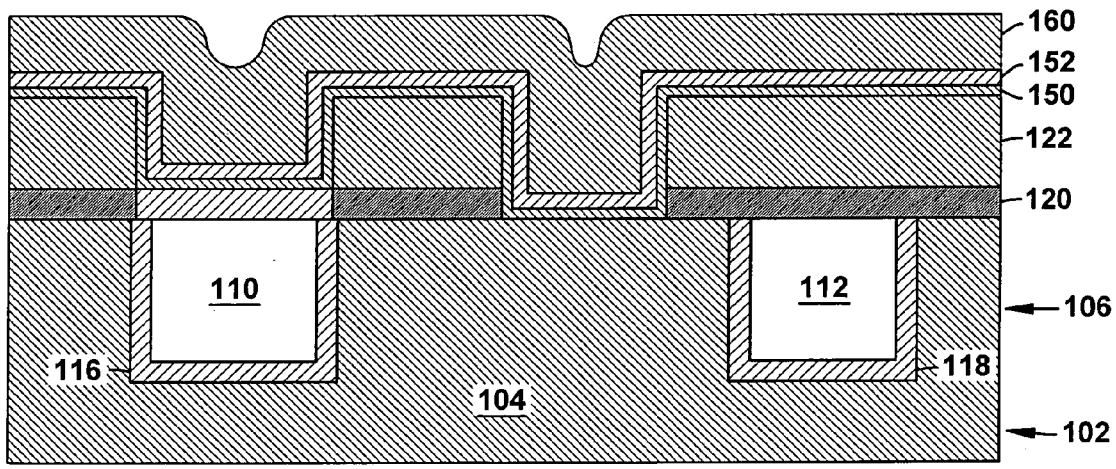
Figure 6:
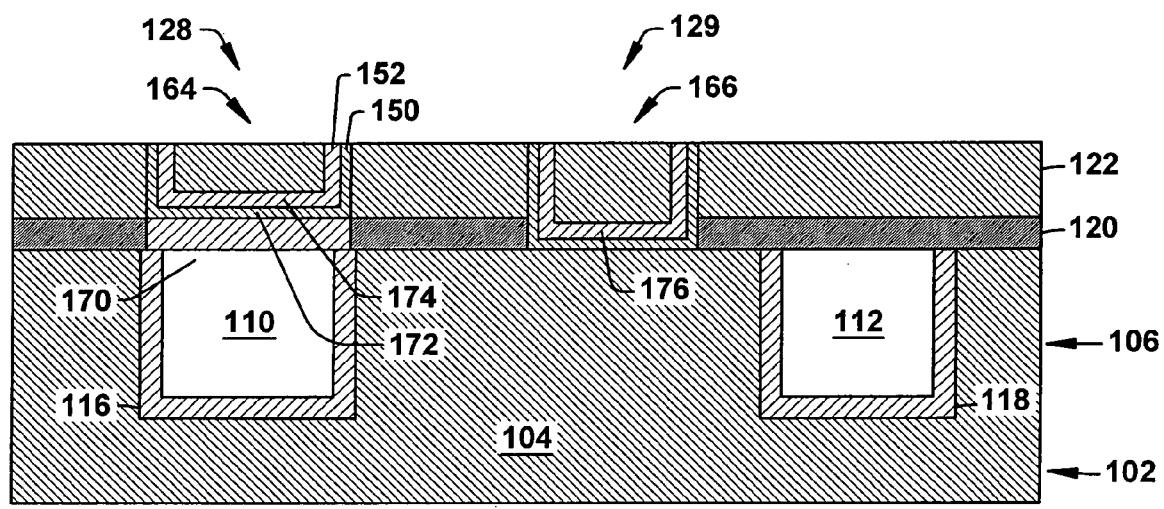

At 22, a layer of oxide material 160 is formed over the layer of top electrode material 152 (FIG. 5). The oxide layer 160 may comprise silicon oxide based dielectrics and/or OSG materials or any other suitable materials that are compatible with the top electrode layer 152, including materials described above with regard to dielectric layer 122. The oxide layer 160 may be formed to a thickness of between about 2500 to about 4500 angstroms, for example. At 24, a chemical mechanical polishing (CMP) process is performed to remove the oxide 160, top electrode 152 and dielectric 150 materials at locations other than within the apertures 128, 129 (FIG. 6). In this manner, any debris that may remain from forming barrier layer 124 or other processes are removed. It will be appreciated, however, that one or more optional etching processes can also be employed in removing these layers at locations other than within the apertures 128, 129. For example, the CMP can initially be utilized to remove the oxide 160 and top electrode 152 layers, followed by a dry and/or wet etch to remove the layer of dielectric material 150. This may prove advantageous as the layer of dielectric material 150 may be substantially harder than the oxide 160 and top electrode 152 layers and may significantly retard the rate of CMP processing.

A MIM capacitor 164 is thus defined within aperture 128 and a resistor 166 is defined within aperture 129. The MIM capacitor 164 is thus made up of a bottom electrode 170, capacitor dielectric 172 and top electrode 174 that respectively comprise the copper deposition 110, remaining portion of the capacitor dielectric layer 150 and remaining portion of the top electrode layer 152. It will be appreciated that since the copper diffusion barrier 124 comprises electrically conductive materials, it may also comprise some of the bottom electrode 170. Similarly, the resistor 166 includes the remaining portion 176 of the top electrode layer 152 within aperture 129. It will be appreciated that the process is also efficient in that it allows the resistor 166 to be formed concurrently with the capacitor 164 without requiring any additional masking or patterning actions.

Figure 7:
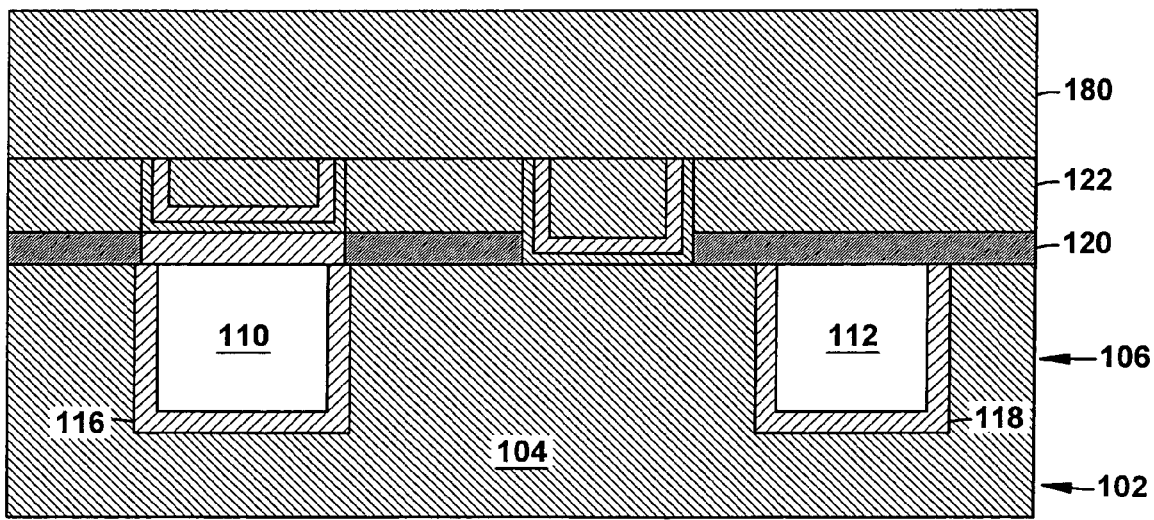

After the CMP and optional etching, the methodology advances to 26 where another layer of dielectric material 180 is formed over the devices 164, 166 and exposed surfaces of layer 122 (FIG. 7). This layer 180 can be referred to as an inter metal dielectric (IMD) or inter layer dielectric (ILD) and can include any suitable dielectric materials, such as those referenced with regard to layer 122. The dielectric layer 180 is formed to a thickness sufficient to establish a stack thickness similar to a situation where a capacitor is not integrated into the substrate, which allows subsequent processing to occur unimpeded. Layer 180 can be formed to a thickness of between about 3000 to about 8000 angstroms, for example.

Figure 8:
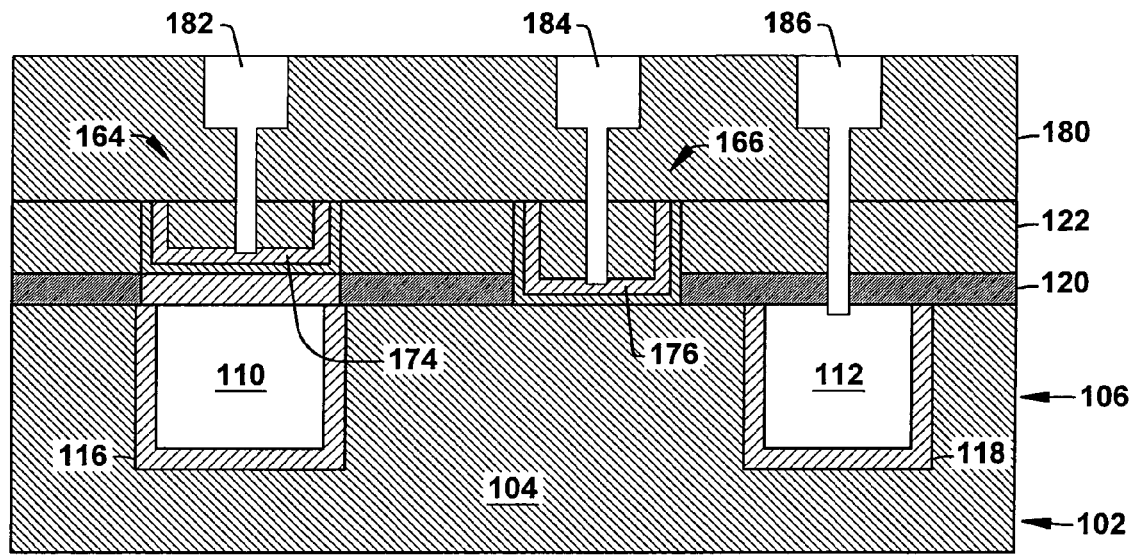
Figure 9:
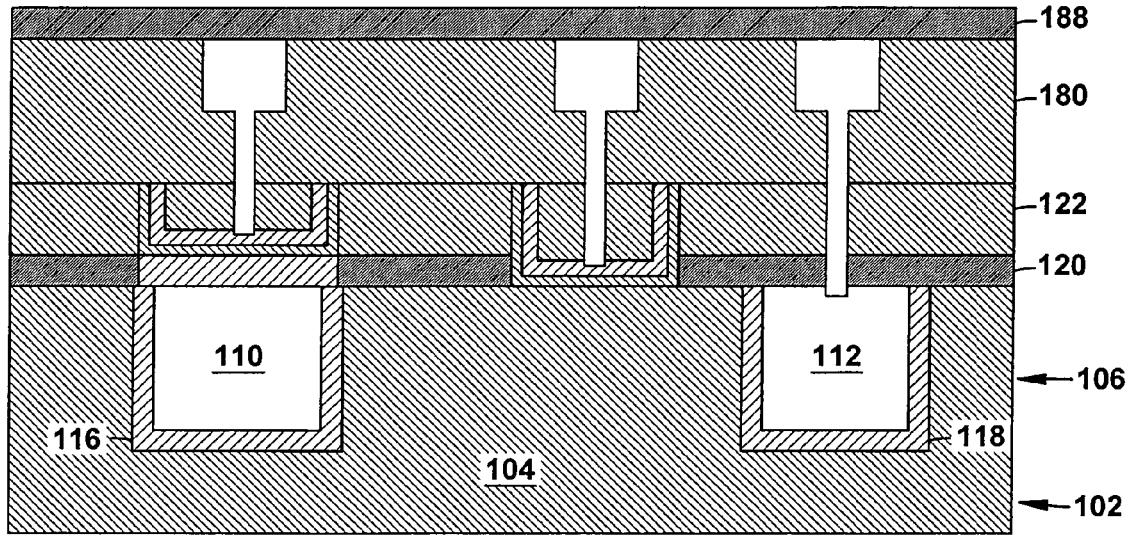

The methodology 10 then advances to 28 for further back end processing. This may include, for example, patterning the dielectric layer 180 and forming conductive contacts therein down to other conductive layers (FIG. 8). For example, respective contacts 182, 184, 186 can be formed down to the top electrode 174 of MIM capacitor 164, the remaining portion 176 of layer 152 of resistor 166 and the metal 112. Subsequently, another layer of etch stop material 188 can be formed thereover in anticipation of developing additional integrated circuit elements (FIG. 9).). Although not shown, it will be appreciated that the resistor 166 can be connected to one or more elements of the chip through additional connections similar to connection 184. Similarly, the resistor could be contacted by forming the resistor so that its ends terminate on copper pads similar to pads 110, 112, for example. It will be appreciated that the presence of the diffusion barrier 124 over metal layer 110 is advantageous as compared to conventional MIM capacitor structures because the presence of diffusion barrier layer 124 between the Cu layer 110 and the dielectric layer 150 mitigates (both thermal and field-enhanced) Cu diffusion. When the top electrode 174 is biased negatively, Cu+ ions have been observed to "drift" through most dielectrics if the field is high enough. This movement of Cu is known as "Cu drift". Mitigating such drift avoids yield degradation and performance loss, and allows a more repeatable capacitance density to be achievable across the wafer from the manufacturing process.

Figure 10:
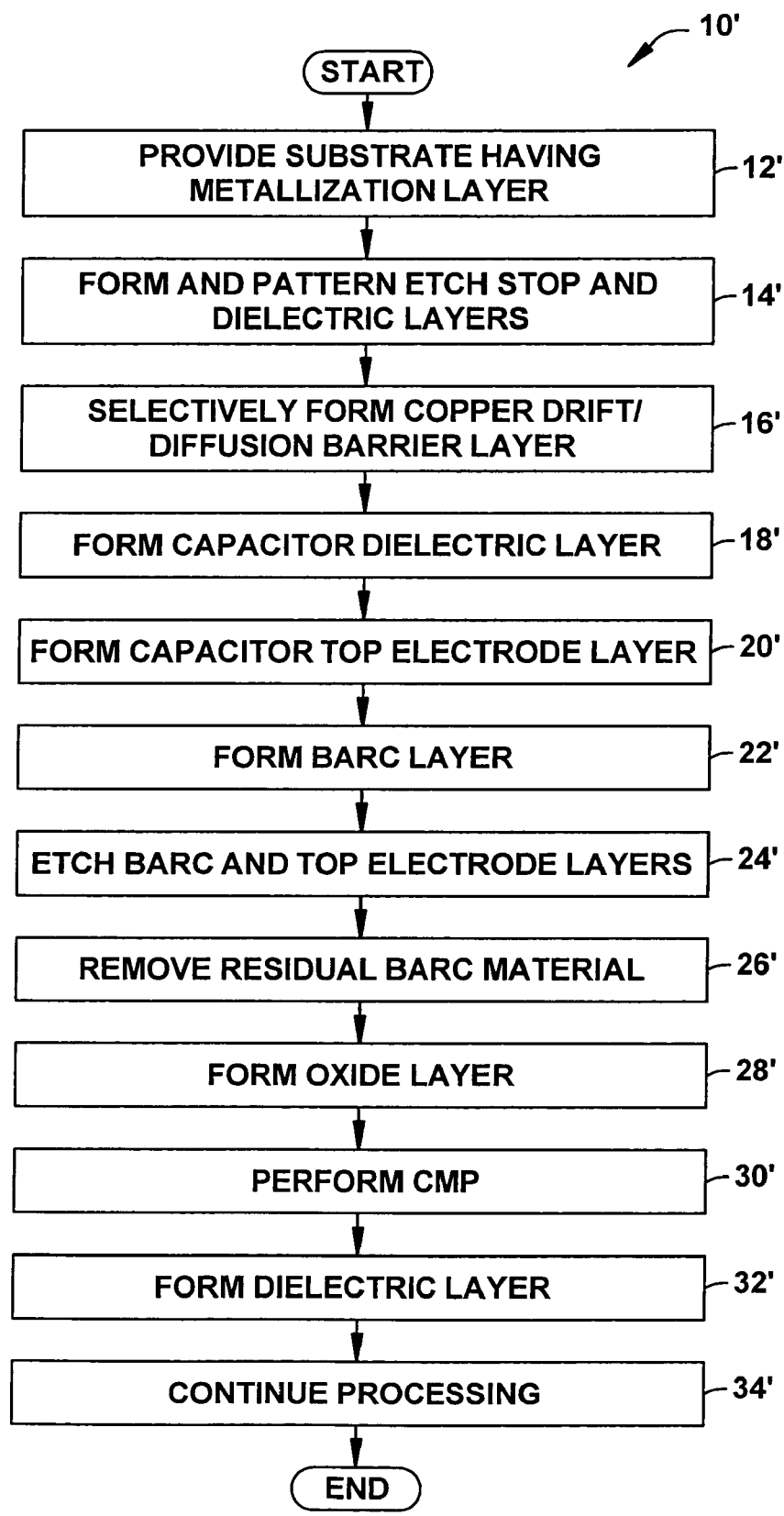
FIG. 10 is a flow diagram illustrating another exemplary methodology for forming a MIM (metal insulator metal) capacitor in accordance with one or more aspects of the present invention.

FIG. 10 illustrates another exemplary methodology 10' for forming a MIM (metal insulator metal) capacitor according to one or more aspects of the present invention. Many of the acts of methodology 10' are similar to those of methodology 10 and thus are addressed with the same reference characters, but having a prime "'" notation. Similarly, layers, elements, etc. within the corresponding cross sectional FIGS. 11–20 are similar to those referred to in FIGS. 2–9 and thus are also labeled with the same reference characters, but also having a prime "'" notation. For purposes of brevity where the same layers, features, elements, acts, etc. of methodology 10 are reproduced in methodology 10' and the accompanying Figs., they are not elaborated upon again.

Figure 11:
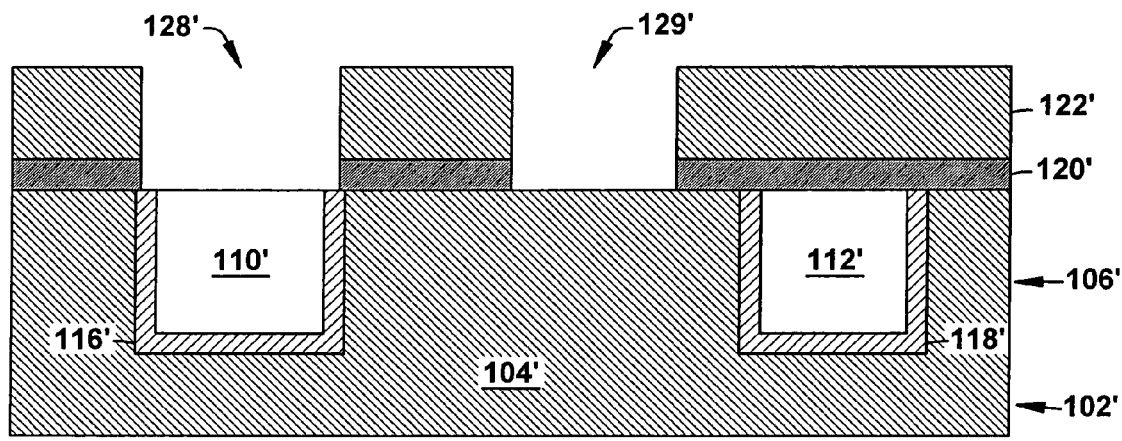
FIGS. 11–20 are cross-sectional illustrations of a MIM capacitor and resistor being concurrently formed according to one or more aspects of the present invention, such as that set forth in FIG. 10.
Figure 12:
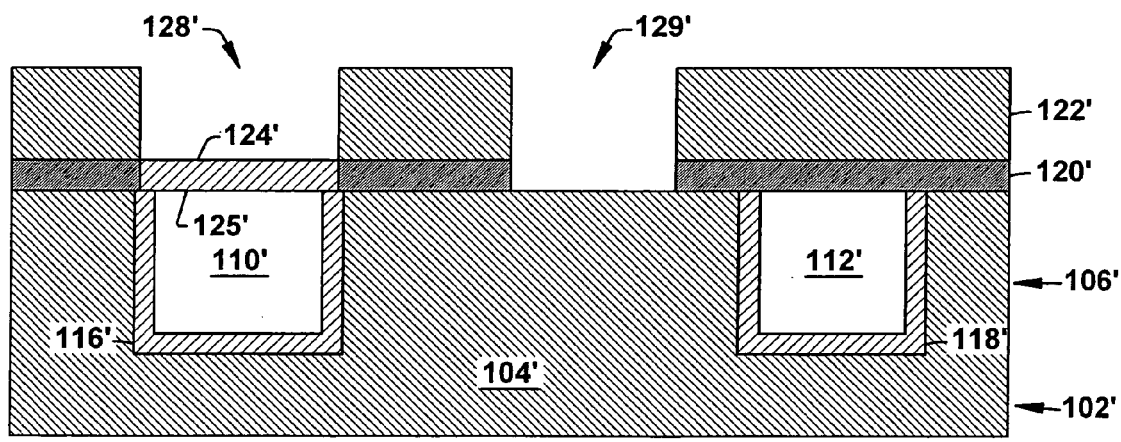
Figure 13:
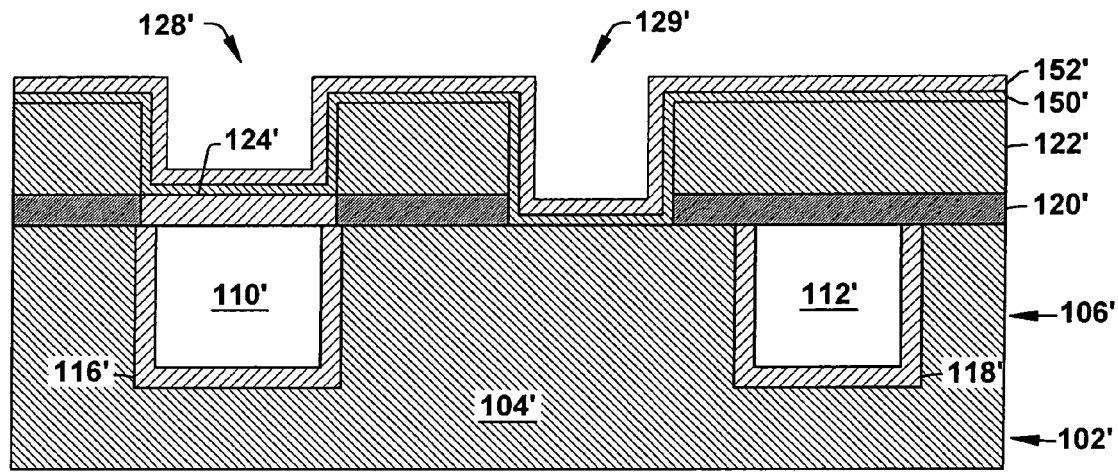

Initially, a substrate 102' is provided that has been processed through formation of a metallization layer 106' at 12' (FIG. 11). The metallization layer 106' includes some dielectric material 104' and one or more metals, namely first and second metals 110', 112' in the illustrated example, and the metals generally comprise copper. A layer of an etch stop material 120' and a layer of a dielectric material 122' are sequentially formed over the substrate 102' and patterned (e.g., etched) at 14' (FIG. 11) to form one or more apertures therein, namely a first aperture 128' and a second aperture 129' in the illustrated example. The first aperture 128' is formed over the first metal 110', while the second aperture 129' is not formed over a metal in the illustrated example. At 16' a copper diffusion barrier 124' is formed over a top surface 125' of the copper 110' via an electro-less deposition process that serves to deposit little to no barrier material at other exposed locations (FIG. 12). The methodology 10' then advances to 18' and 20' where a layer of capacitor dielectric material 150' and a layer of capacitor top electrode material 152' are respectively formed (FIG. 13).

Figure 14:
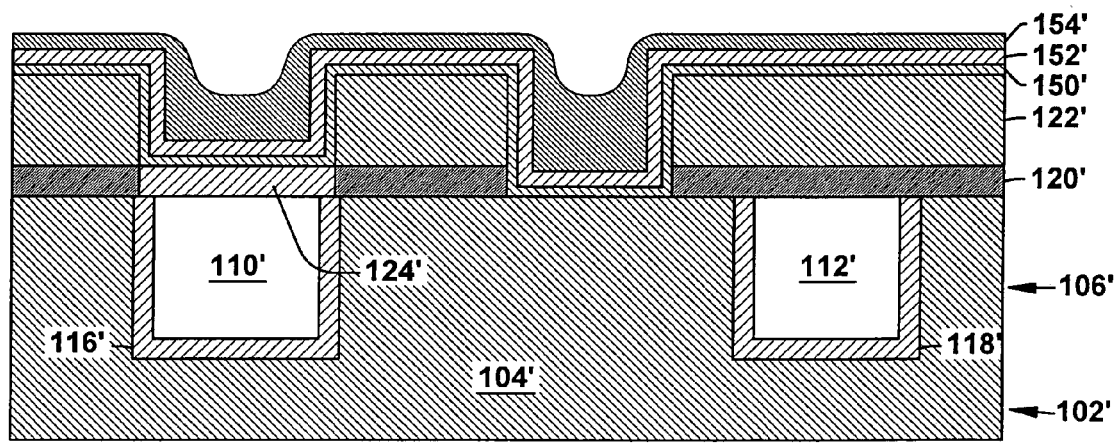
Figure 15:
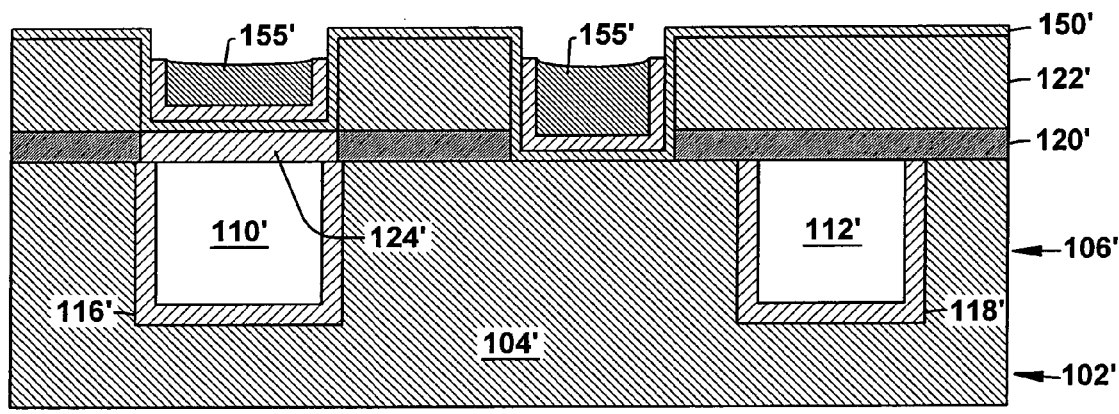
Figure 16:
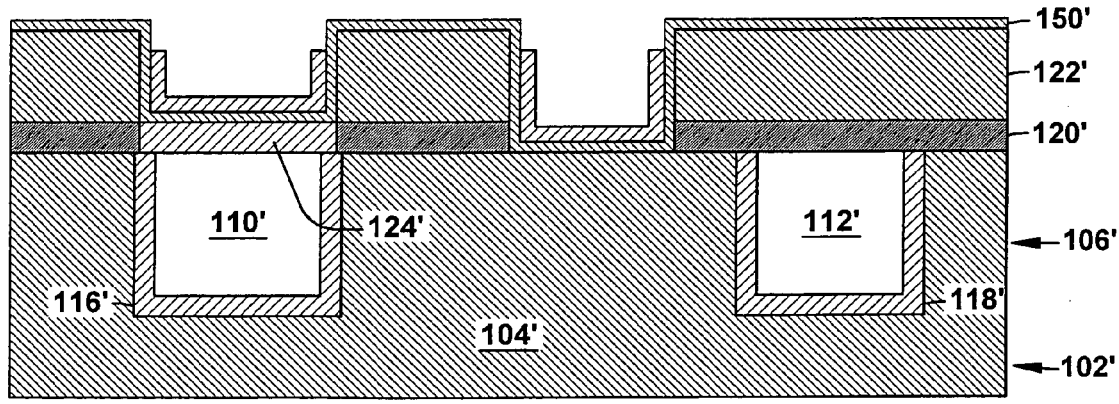

At 22', a layer of bottom antireflective coating (BARC) material 154' is formed over the layer of top electrode material 152' (FIG. 14). The BARC layer 154' generally includes organic material that may be spun-on to a thickness of between about 300 to about 700 angstroms, for example. BARC material is generally used in photolithographic processing for its light attenuating properties which mitigate phenomena known as standing waves, among other things, thereby serving to improve the fidelity of pattern transfers. The BARC material 154' is used here, however, because it readily flows into apertures 128' and 129' when it is applied and also has a desired etch rate and/or etch selectivity (e.g., relative to other material(s) exposed to the removing species). By way of example, Shipley AR™19 is one type of suitable BARC material that may be used for layer 154'. At 24', an etching process is performed to remove some of the BARC 154' and top electrode 152' layers (FIG. 15). In particular, some of the thicker "pooled" BARC material 155' within the apertures 128' and 129' remains as does top electrode material 152' that is protected by this overlying "pooled" BARC material 155'. The residual BARC material 155' is then removed from the apertures 128', 129' at 26' (FIG. 16). For example, an oxidizing solvent clean can be employed to dissolve or lift-off by delamination the residual BARC material. Further, via spectroscopic assisted endpoint detection, the BARC material can be controllably (wet or dry) etched or ashed to a recess level as desired. Similarly, an etching process can be utilized that is highly selective to the layer of capacitor dielectric material 150' as well as the layer of top electrode material 152' (that underlies the residual BARC material). It will be appreciated, however, that while a layer of BARC material is referenced herein, any one or more suitable types of sacrificial filler materials that possess desired performance characteristics may be used for layer 154'. For example, a layer of inorganic dielectric material could be used as a sacrificial filler material that would flow into apertures 128' and 129' and have a desired etch rate and/or etch selectivity. By way of example, HSQ (hydrogen silsesquioxane) from Dow Corning is one type of suitable inorganic dielectric material that may be used for layer 154'.

Figure 17:
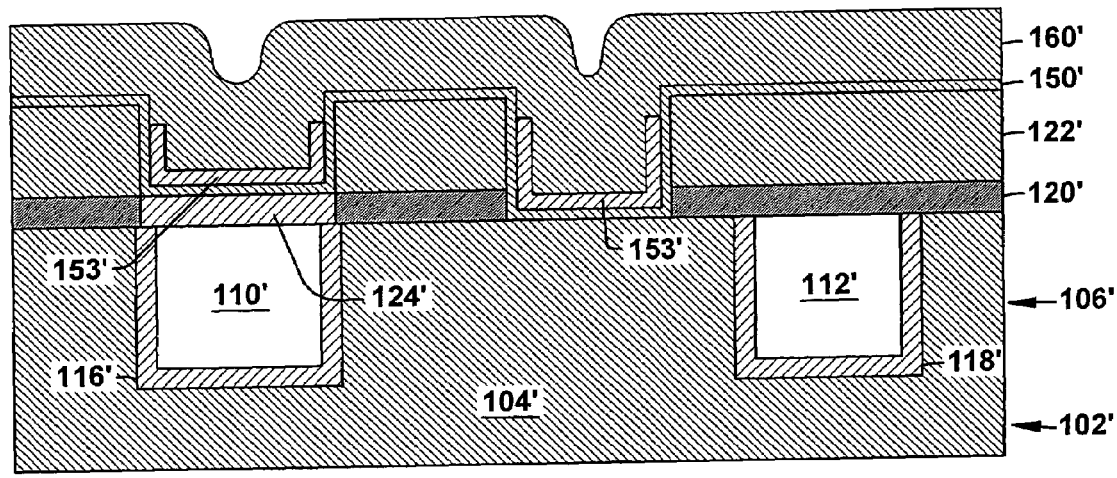
Figure 18:
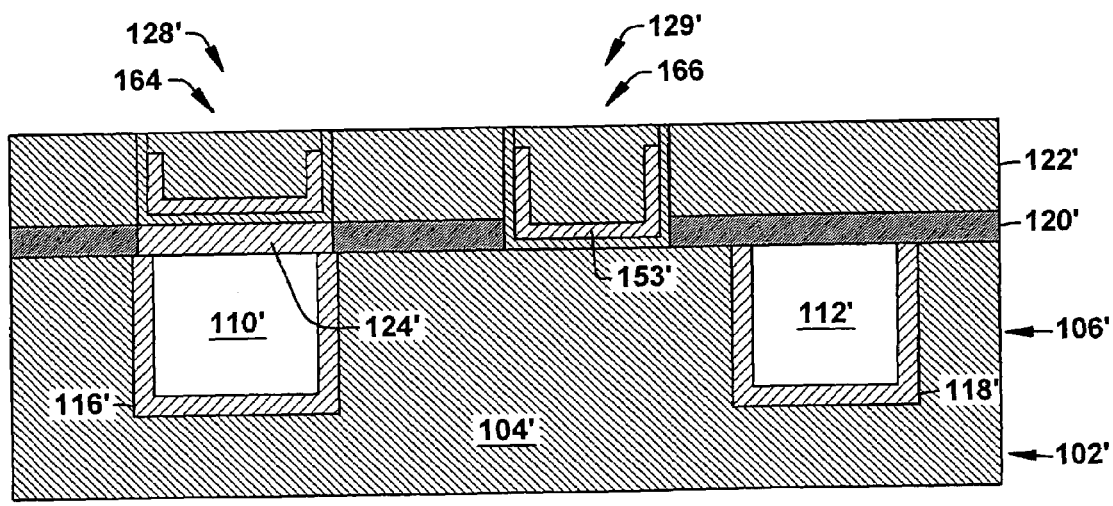

A layer of oxide material 160' is then formed over exposed areas of the layer of capacitor dielectric material 150' as well as remaining portions 153' of the layer of top electrode material 152' at 28' (FIG. 17). A CMP (and optional etch) is performed at 30' so that the oxide material 160' and capacitor dielectric material 150' are removed to reveal the MIM capacitor 164' and the resistor 166' that is concurrently formed in the second aperture 129' from the remaining portion 153' of the layer of top electrode material 152' (FIG. 18). It will be appreciated that recessing the layer of top electrode material 152' utilizing the BARC material 154' (FIGS. 14–16) simplifies the CMP performed at 30'. In particular, since the conductive (metal) layer of top electrode material 152' is already removed, the chemistry of the CMP merely has to be formulated to remove the nonconductive (dielectric) layers 160' and 150'. Although not shown, it will also be appreciated that an optional etch stop layer can also be formed over the layer of top electrode material 152' after that layer is formed at 20'. Such an etch stop layer would facilitate selectively etching some of the BARC away at 24', as well as protecting the remaining portions 153' of the top electrode material 152' when the residual BARC material 155' is removed from the apertures 128' and 129' at 26'.

Figure 19:
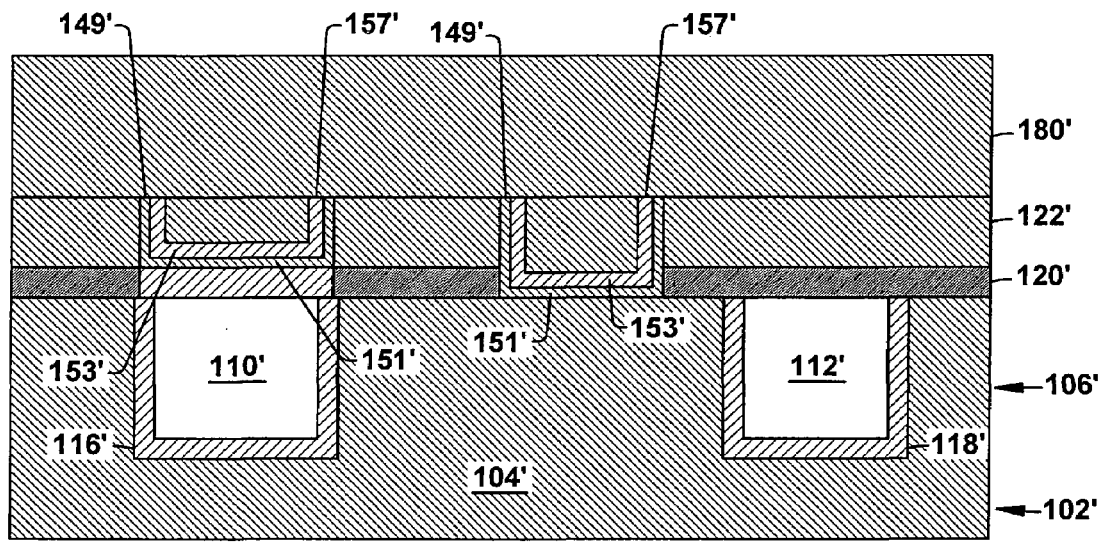

The methodology 10' then advances to 32' where an IMD or ILD 180' is formed over the devices 164' and 166' and exposed surfaces of layer 122' (FIG. 19). Thereafter, further back end processing can take place at 34' where, for example, respective conductive connections 182', 184', 186' can be formed down to the MIM capacitor 164', resistor 166' and metal 112' and/or another layer of etch stop material 188' can be formed thereover in anticipation of developing additional integrated circuit elements (FIG. 20).

Figure 20:
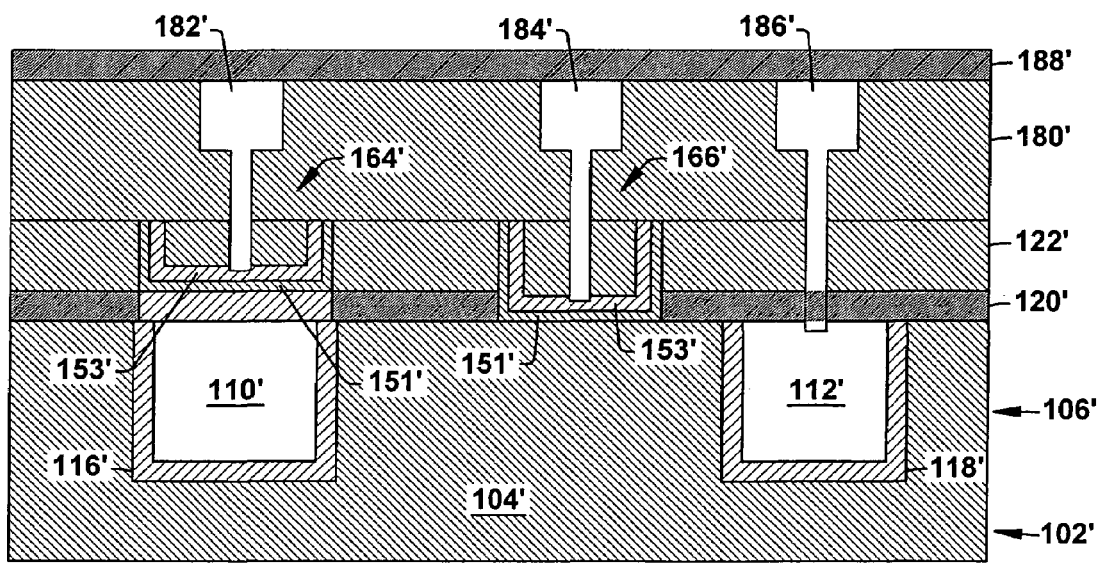

By way of example, it can be seen that a slightly different arrangement is depicted in FIG. 18 as compared to the arrangement presented in FIGS. 19–20. In FIG. 18, for example, the CMP and optional etch performed at 30' are illustrated as basically stopping as soon as the capacitor dielectric material 150' is cleared. In FIGS. 19–20, however, the CMP and optional etch continue for a little while longer such that the layer of dielectric material 122', top surfaces 149' of remaining portions 151' of the layer of capacitor dielectric material 150' and top surfaces 157' of remaining portions 153' of the layer of top electrode material 152' are substantially flush with one another. Both scenarios are anticipated as failing within the scope of the present invention.

It will be appreciated that while reference is made throughout this document to exemplary structures in discussing aspects of methodologies described herein (e.g., those structures presented in FIGS. 2–9 while discussing the methodology set forth in FIG. 1, and those structures presented in FIGS. 11–20 while discussing the methodology set forth in FIG. 10), that those methodologies are not to be limited by the corresponding structures presented. Rather, the methodologies (and structures) are to be considered independent of one another and able to stand alone and be practiced without regard to any of the particular aspects depicted in the Figs.

It will also be appreciated that copper diffusion barriers, including those disclosed herein, are typically formed using conductive compounds of transition metals, such as tantalum, tungsten and titanium alone or in combination with their respective nitrides, carbonitrides, silicon nitrides and/or silicon carbonitrides (e.g., Ta, TaN, TaSiN, titanium nitride, tungsten nitride, silicon nitride, silicon oxynitride, silicon carbide). It will be appreciated, however, that any and all barrier materials with sufficient Cu barrier properties are contemplated as falling within the scope of the present invention.

Further, from time to time throughout this specification and the claims that follow, one or more layers or structures may be described as being or containing a substance such as "tungsten", "copper", "silicon nitride", etc. These description are to be understood in context and as they are used in the semiconductor manufacturing industry. For example, in the semiconductor industry, when a metallization layer is described as containing copper, it is understood that the metal of the layer comprises pure copper as a principle component, but the pure copper may be, and typically is, alloyed, doped, or otherwise impure. As another example, silicon nitride may be a silicon rich silicon nitride or an oxygen rich silicon nitride. Silicon nitride may contain some oxygen, but not so much that the material's dielectric constant is substantially different from that of high purity stoichiometric silicon nitride.

Although one or more aspects of the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

Also, the term "exemplary" is merely meant to mean an example, rather than the best. It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, unless stated otherwise and/or specified to the contrary, any one or more of the layers set forth herein can be formed in any number of suitable ways, such as with spin-on techniques, sputtering techniques (e.g., magnetron and/or ion beam sputtering), (thermal) growth techniques and/or deposition techniques such as chemical vapor deposition (CVD), physical vapor deposition (PVD) and/or plasma enhanced chemical vapor deposition (PECVD), or atomic layer deposition (ALD), for example.

What is claimed is:

1. A method of forming a MIM (metal insulator metal) capacitor, comprising:
    forming first and second apertures within a layer of dielectric material and a layer of etch stop material where the layer of dielectric material overlies the layer of etch stop material and the layer of etch stop material overlies a metallization layer formed within a substrate, where the first aperture is formed down to a copper deposition within the metallization layer of the substrate;
    forming a layer of copper diffusion barrier material over a top surface of the deposition of copper, where the copper deposition serves as at least some of a bottom electrode of the capacitor, wherein the barrier material is deposited via an electro-less deposition process whereby little to no barrier material forms on exposed surfaces other than the top surface of the copper deposition;
    forming a layer of capacitor dielectric material over exposed surfaces and down into the first and second apertures;
    forming a layer of capacitor top electrode material over the layer of capacitor dielectric material;
    forming a layer of oxide material over the layer of capacitor top electrode material; and
    performing a CMP and optional etch to remove the layer of oxide material, layer of capacitor top electrode material and layer of capacitor dielectric material back to the layer of dielectric material, thereby exposing at least a portion of the MIM capacitor formed within the first aperture and at least a portion of a resistor formed within the second aperture.

2. The method of claim 1, wherein the copper diffusion barrier material comprises at least one of Cr, W, Ta, Mo, Rh, Ru, Go, W, Ta, Mo, CoWP, CoWB, NiMoP and NiMoB.

3. The method of claim 2, wherein the copper diffusion barrier material comprises greater than about 10% W and greater than about 10% non-metal content.

4. The method of claim 1, wherein the copper diffusion barrier material is formed to a thickness of less than about 500 angstroms.

5. The method of claim 1, wherein the copper diffusion barrier material is stable to about 400 degrees Celsius.

6. The method of claim 1, wherein the copper diffusion barrier material comprises a palladium activated substance, the method further comprising:
    depositing a layer of palladium material from a palladium chloride solution over the deposition of copper before the layer of copper diffusion barrier material is formed.

7. The method of claim 6, wherein the layer of palladium material is formed to a thickness of less than about 300 angstroms.

8. The method of claim 6, further comprising:
    cleaning exposed surfaces before the layer of palladium material is deposited.

9. The method of claim 1, further comprising:
    performing a wet etch after the layer of copper diffusion barrier material is formed to remove spurious nuclei of barrier material that may be formed on surfaces other than the top surface of the deposition of copper.

10. The method of claim 1, wherein the layer of capacitor dielectric material is formed to a thickness of less than about 600 angstroms.

11. The method of claim 1, wherein the layer of capacitor top electrode material is formed to a thickness of between about 400 to about 900 angstroms.

12. The method of claim 1, wherein the layer of oxide material comprises at least one of silicon oxide based dielectrics and OSG materials.

13. The method of claim 1, wherein the layer of oxide material is formed to a thickness of between about 2500 to about 4500 angstroms.

14. The method of claim 1, further comprising:
    forming a layer of IMD material over the MIM capacitor and resistor and exposed surfaces of the layer of dielectric material; and
    forming conductive contacts down to the MIM capacitor and resistor in the layer of IMD material.

15. The method of claim 14, wherein the layer of IMD material is formed to a thickness of between about 3000 to about 8000 angstroms.

16. A method of forming a MIM (metal insulator metal) capacitor, comprising:
    forming first and second apertures within a layer of dielectric material and a layer of etch stop material where the layer of dielectric material overlies the layer of etch stop material and the layer of etch stop material overlies a metallization layer formed within a substrate, where the first aperture is formed down to a copper deposition within the metallization layer of the substrate;
    forming a layer of copper diffusion barrier material over a top surface of the deposition of copper, where the copper deposition serves as at least some of a bottom electrode of the capacitor, wherein the barrier material is deposited via an electro-less deposition process whereby little to no barrier material forms on exposed surfaces other than the top surface of the copper deposition;
    forming a layer of capacitor dielectric material over exposed surfaces and down into the first and second apertures;
    forming a layer of capacitor top electrode material over the layer of capacitor dielectric material;
    forming a layer of sacrificial filler material over the layer of capacitor top electrode material;
    removing at least some of the layer of sacrificial filler material, whereby at least some of the sacrificial filler material remains pooled within the first and second apertures;
    removing portions of the layer of capacitor top electrode material that are not protected by the overlying pooled sacrificial filler material within the first and second apertures;
    removing the residual pooled sacrificial filler material from the first and second apertures;
    forming a layer of oxide material over exposed portions of the layer of capacitor dielectric material and portions of the layer of capacitor top electrode material remaining within the first and second apertures; and
    performing a OMP and optional etch to remove the layer of oxide material and layer of capacitor dielectric material back to the layer of dielectric material, thereby exposing at least a portion of the MIM capacitor formed within the first aperture and at least a portion of a resistor formed within the second aperture.

17. The method of claim 16, wherein the layer of sacrificial filler material comprises at least one of BARO material and inorganic dielectric material.

18. The method of claim 16, wherein at least one of:

the layer of sacrificial filler material is formed to a thickness of between about 300 to about 700 angstroms;

the BARO material comprises ARTMl9;

the inorganic dielectric material comprises HSQ; and an oxidizing solvent is used to remove residual BARO material.

19. The method of claim 16, further comprising:

forming a layer of IMD material over the MIM capacitor and resistor and exposed surfaces of the layer of dielectric material;

forming conductive contacts down to the MIM capacitor and resistor in the layer of IMD material; and forming a layer of etch stop material over the conductive contacts and exposed surfaces of the layer of IMD material.

\* \* \* \* \*